(12) United States Patent
Liao et al.

(10) Patent No.: US 12,159,894 B2
(45) Date of Patent: Dec. 3, 2024

(54) DISPLAY DEVICE

(71) Applicant: InnoLux Corporation, Miao-Li County (TW)

(72) Inventors: Hsiao-Feng Liao, Miao-Li County (TW); Shu-Fen Li, Miao-Li County (TW); Chuan-Chi Chien, Miao-Li County (TW); I-An Yao, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 535 days.

(21) Appl. No.: 17/468,716

(22) Filed: Sep. 8, 2021

(65) Prior Publication Data

US 2022/0115433 A1    Apr. 14, 2022

(30) Foreign Application Priority Data

Oct. 9, 2020    (CN) .......................... 202011073890.0

(51) Int. Cl.
*H01L 27/146* (2006.01)
*G06V 40/13* (2022.01)

(52) U.S. Cl.
CPC .... *H01L 27/14678* (2013.01); *G06V 40/1318* (2022.01); *H01L 27/1461* (2013.01); *H01L 27/14623* (2013.01); *H01L 27/14636* (2013.01)

(58) Field of Classification Search
CPC ........... H01L 27/1462; H01L 27/14621; H01L 27/14623; H01L 27/14625; H01L 27/14627; H01L 27/14629; H01L 27/1463; H01L 27/1464; H01L 27/14636; H01L 27/14603; H01L 27/14678; G06V 40/1318

See application file for complete search history.

(56) References Cited

U.S. PATENT DOCUMENTS

| | | | |
|---|---|---|---|
| 8,581,170 B2 | 11/2013 | Kurokawa | |
| 10,248,249 B2 | 4/2019 | Liu | |
| 10,564,464 B2 | 2/2020 | Wang | |
| 10,872,922 B2 | 12/2020 | Jia | |
| 2014/0091418 A1* | 4/2014 | Taguchi | G02B 5/201 257/432 |
| 2015/0281620 A1* | 10/2015 | Usuda | H04N 25/773 257/438 |
| 2018/0165496 A1* | 6/2018 | Cheng | G09F 9/00 |
| 2018/0190696 A1* | 7/2018 | Lee | H01L 27/14636 |
| 2018/0307887 A1* | 10/2018 | Han | H01L 21/70 |
| 2020/0119108 A1* | 4/2020 | Park | G06V 40/1318 |
| 2020/0176506 A1* | 6/2020 | Yu | H01L 27/14612 |
| 2021/0158007 A1* | 5/2021 | Li | H01L 27/14612 |

FOREIGN PATENT DOCUMENTS

CN    105975963 A    9/2016

* cited by examiner

*Primary Examiner* — Fernando L Toledo
*Assistant Examiner* — Marshall Mu-Nuo Hatfield
(74) *Attorney, Agent, or Firm* — Winston Hsu

(57) ABSTRACT

A display device includes a substrate, a photosensitive element formed above the substrate, a signal line formed above the substrate, and a transparent conductive member electrically connected to the signal line and the photosensitive element. In a normal direction of the substrate, the signal line does not overlap with the photosensitive element.

15 Claims, 4 Drawing Sheets

DISPLAY DEVICE

BACKGROUND OF THE DISCLOSURE

1. Field of the Disclosure

The disclosure is related to a display device, and more particularly to a display device with photosensitive elements.

2. Description of the Prior Art

In the prior art, the display panel is provided with photosensitive elements to detect fingerprints. The photosensitive element generates a corresponding light-receiving current or voltage according to the amount of received light. Therefore, the light intensity can be obtained according to the light-receiving current or voltage generated by the photosensitive element, and the texture on the surface of the object can be inferred. However, when the photosensitive element is installed, the light-receiving surface of the photosensitive element is often blocked by non-transparent signal lines, resulting in a decrease in the light sensing performance of the photosensitive element. Therefore, it is an objective to develop a design with a structure that can improve the quality of the display devices.

SUMMARY OF THE DISCLOSURE

An embodiment discloses a display device comprising a substrate, a photosensitive element formed above the substrate, a signal line formed above the substrate, and a transparent conductive member electrically connected to the signal line and the photosensitive element. In a normal direction of the substrate, the signal line does not overlap with the photosensitive element.

These and other objectives of the present disclosure will no doubt become obvious to those of ordinary skill in the art after reading the following detailed description of the embodiment that is illustrated in the various figures and drawings.

DETAILED DESCRIPTION

Figure 1:
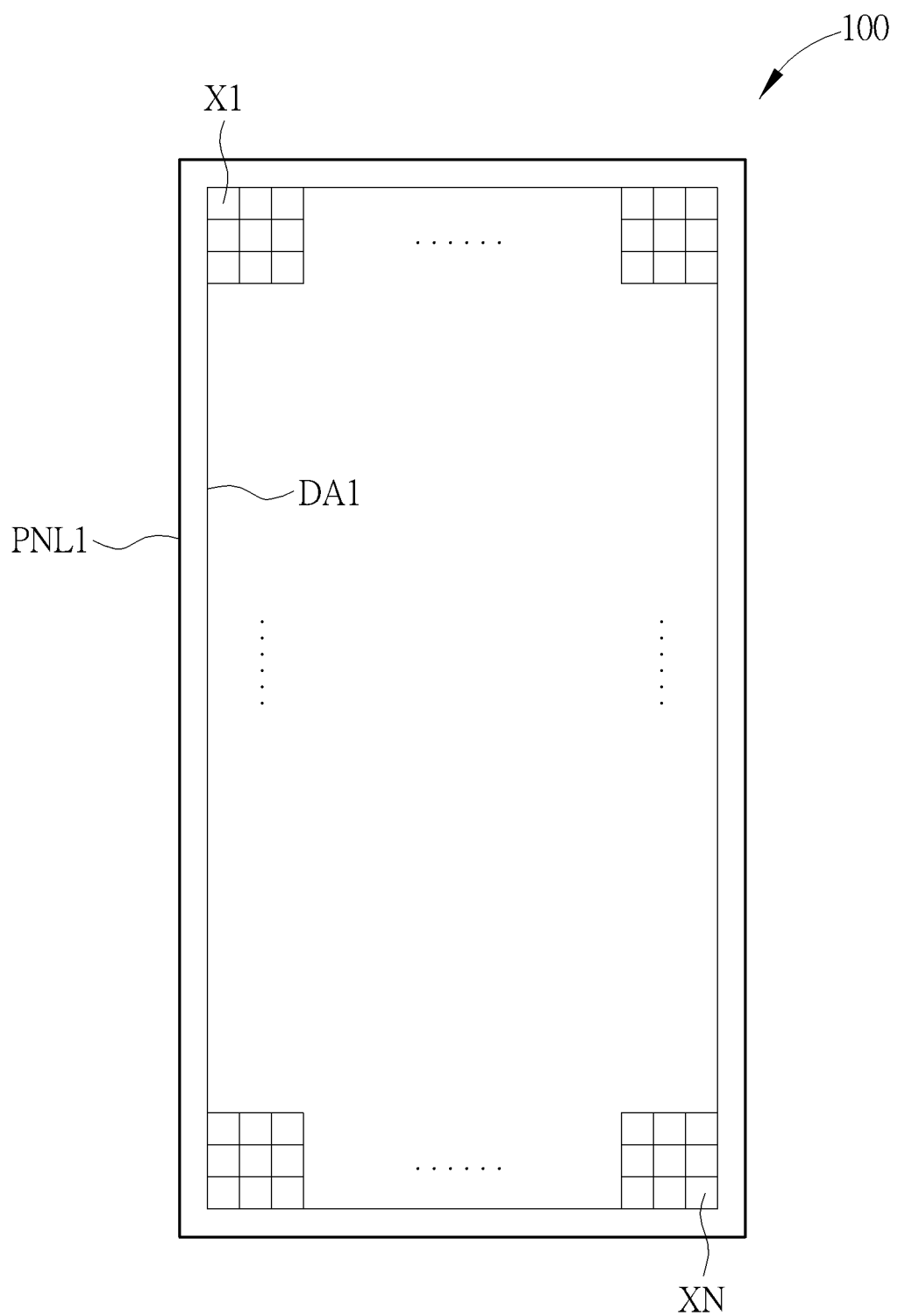
FIG. 1 is a schematic diagram of a display device according to an embodiment of the disclosure.

Reference will now be made in detail to some embodiments of the present disclosure, and examples of some embodiments are illustrated in the accompanying simplified drawings. The components may not be drawn to scale. In addition, the number and size of each element in the drawings are merely illustrative, and are not used to limit the scope of the disclosure.

Throughout the disclosure and the appended claims, certain words are used to refer to specific elements. Those skilled in the art should understand that electronic device manufacturers may refer to the same elements with different names, and this disclosure does not intend to distinguish those elements with the same function but different names. In the following description and claims, the words "comprising" and "including" etc. are all open-ended words, so they should be interpreted as meaning "comprising but not limited to . . . ".

The directional terms mentioned in the following embodiments, such as up, down, left, right, front or back, etc., are only the directions with reference to the drawings. Therefore, the directional terms are used to illustrate and not to limit the disclosure. It must be understood that the elements specifically described or illustrated can exist in various forms well known to those skilled in the art. In addition, when an element or film layer is referred to as being on or connected to another element or film layer, it should be understood that the element or film layer is directly located on another element or another film layer, or directly connected to another element or film layer, or there may be other elements or film layers between the two (indirect). But on the contrary, when an element or film is said to be "directly on" or "directly connected to" another element or film, it should be understood that there is no element or film therebetween.

The ordinal numbers used in the specification and the claims, such as "first", "second", etc., are used to modify the elements of the claims. They do not imply and represent that the claimed element has any previous ordinal numbers, nor does it represent the order of a certain claimed element and another claimed element, or the order in the manufacturing process. The use of these ordinal numbers is only used to make a claimed element with a certain name be clearly distinguishable from another claimed element with the same name.

Unless otherwise defined, all terms (including technical and scientific terms) used herein have the same meanings commonly understood by the skilled in the art. It is understandable that these terms, such as those defined in commonly used dictionaries, should be interpreted as having a meaning consistent with the relevant technology and the background or context of this disclosure, rather than in an idealized or overly formal way, unless specifically defined here. In addition, the term "substrate" in the following text may include elements already formed on the substrate or various films covering the substrate. For example, any required active elements (such as transistors) may be formed on the substrate. However in order to simplify the diagram, the substrate is only shown as being flat.

It should be noted that the technical solutions provided by the different embodiments below can be used interchangeably, combined or mixed to form another embodiment without violating the spirit of the present disclosure.

The display device of the present disclosure may comprise, for example, a spliced display device, a touch display device, a curved display device, or a non-rectangular display device (free shape display), but it is not limited thereto. The display device can be a bendable or flexible electronic device. The display device may comprise, for example, liquid crystals, light emitting diodes, fluorescence, phosphor, other suitable display media, or a combination of the foregoing, but is not limited thereto. The light emitting diode may comprise, for example, an organic light emitting diode (OLED), a submillimeter light emitting diode (mini LED), a micro light emitting diode (micro LED), or a quantum dot light emitting diode (for example, QLED, QDLED) or other suitable materials or any combination of the above materials, but not limited thereto. In addition, the display device may be rectangular, circular, polygonal, a shape with curved edges, or other suitable shapes. It should be noted that the electronic device can be any combination of the foregoing, but is not limited thereto.

Figure 2:
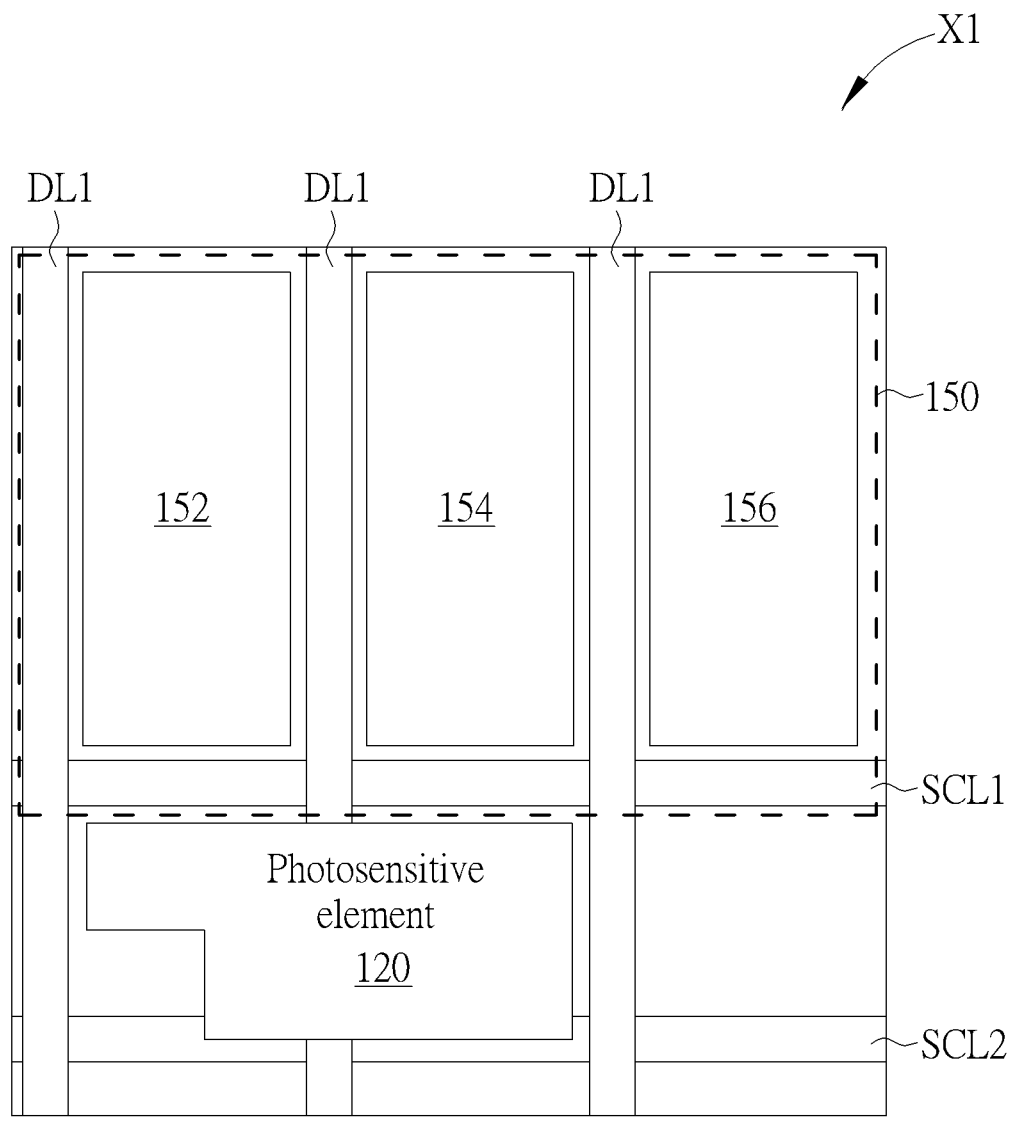
FIG. 2 is a layout diagram of a pixel of the display device in FIG. 1 according to an embodiment of the disclosure.

FIG. 1 is a schematic diagram of a display device 100 according to an embodiment of the disclosure. The display device 100 may include a panel PNL1 and a plurality of pixels X1 to XN arranged in a display area DA1. In some embodiments, the pixels X1 to XN may have the same structure. FIG. 2 is a layout diagram of the pixel X1 according to an embodiment of the disclosure. In FIG. 2, the pixel X1 may include a display pixel 150 and a photosensitive element 120.

In some embodiments, the display pixel 150 may include sub-pixels 152, 154, and 156 for emitting light of different colors. For example, the sub-pixel 152 may be used to emit red light, for example but not limited thereto, the sub-pixel 154 may be used to emit green light, for example but not limited thereto, and the sub-pixel 156 may be used to emit blue light, for example, but not limited thereto. In FIG. 2, the sub-pixels 152, 154, and 156 can be electrically connected to the corresponding data lines DL1, and can be electrically connected to the scan line SCL1. In other words, the sub-pixels 152, 154, and 156 can perform scanning operations in the same time period according to the scan signal on the scan line SCL1, and read the corresponding data signals from the corresponding data lines DL1, so that the sub-pixels 152, 154 and 156 of different colors can each emit light of corresponding intensity, and enable the display pixel 150 to present the desired color.

In FIG. 2, the photosensitive element 120 can be electrically connected to the scan line SCL2, and the display pixel 150 and the photosensitive element 120 do not overlap in the top view. The photosensitive element 120 can generate a corresponding light-sensing current or voltage according to the amount of received light. Therefore, according to the light-sensing currents or voltages generated by the photosensitive elements 120 of the pixels X1 to XN, the distribution of light reception in the display area DA1 can be known, and the surface texture of the object above the display area DA1 can be inferred. In some embodiments, the display device 100 can sense fingerprints on the display area DA1 through the photosensitive elements 120 in the pixels X1 to XN.

Figure 3:
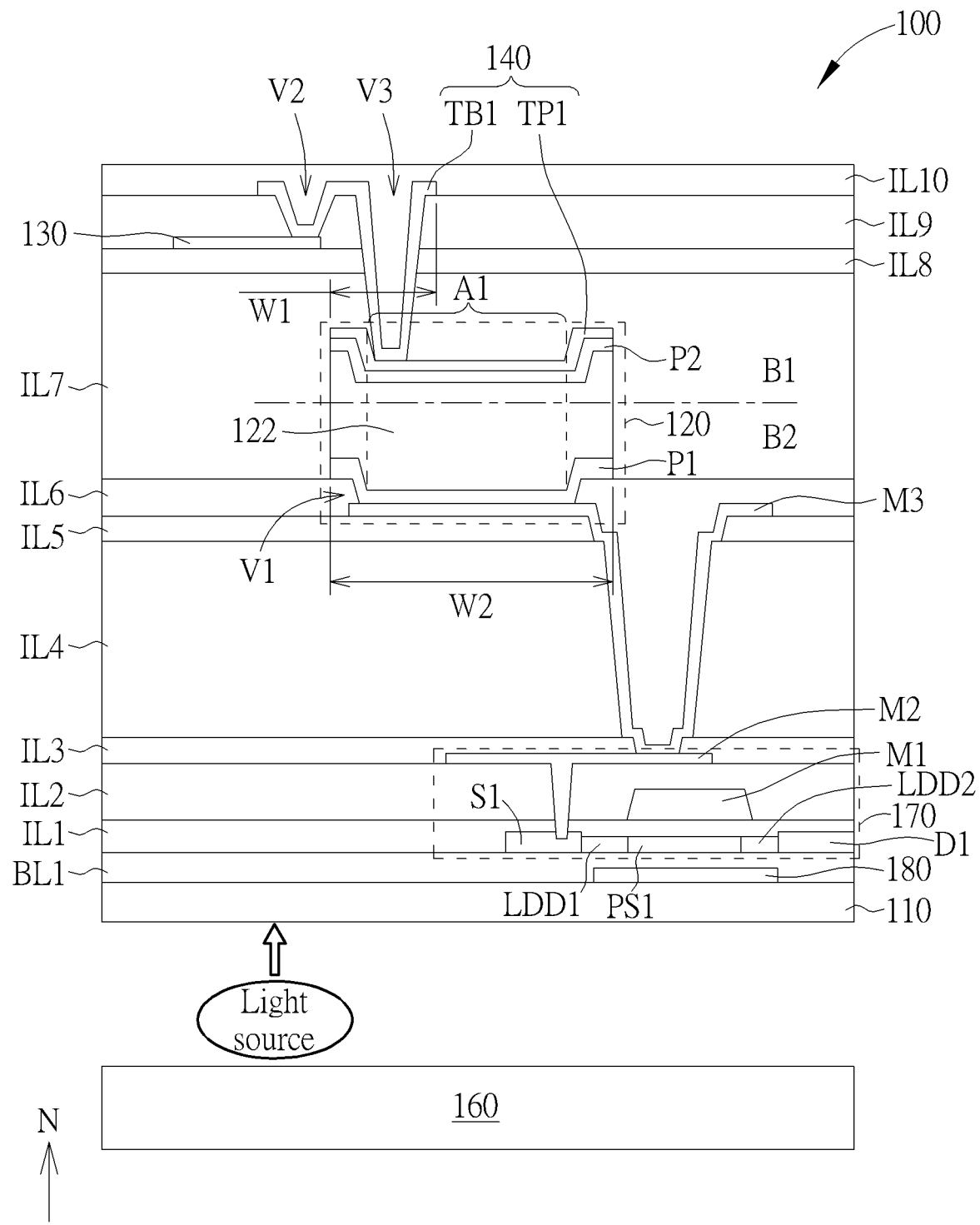
FIG. 3 is a cross-sectional view of the display device in FIG. 1 according to an embodiment of the disclosure.

FIG. 3 is a cross-sectional view of the display device 100 according to an embodiment of the disclosure. In FIG. 3, the display device 100 may include a substrate 110, a photosensitive element 120 and a signal line 130.

In some embodiments, the substrate 110 may be a flexible substrate or a non-flexible substrate. The material of the substrate 110 may be glass, quartz, sapphire, ceramic, polycarbonate (PC), polyimide (PI), polyethylene terephthalate (PET), other suitable substrate materials, or a combination of the foregoing, but not limited thereto.

The photosensitive element 120 may be formed above the substrate 110, and the photosensitive element 120 may include electrodes P1 and P2 and an amorphous silicon layer 122. In some embodiments, the photosensitive element 120 may include a phase shift switch diode. The electrode P1 may be an N electrode, and the electrode P2 may be a P electrode, but is not limited thereto. In some other embodiments, the electrode P1 may be a P electrode, and the electrode P2 may be an N electrode.

In addition, although the photosensitive element 120 uses the amorphous silicon layer 122 as a low-doped intrinsic semiconductor layer of the phase shift switch diode, in some other embodiments, the amorphous silicon layer 122 may also be replaced by other material layers. For example, the photosensitive element 120 can use polysilicon, single crystal silicon, germanium (Ge), gallium arsenide (GaAs), indium phosphide (InP), cadmium telluride (CdTe), cadmium sulfide (CdS), or other organic materials, such as polythiophene (P3HT), fullerene derivatives (PCBM), indene-carbon 60 double adduct (ICBA) or polystyrene sulfonic acid (PEDOT):PSS).

In FIG. 3, the signal line 130 may be electrically connected to the photosensitive element 120. The signal line 130 can transmit the light-sensing current or voltage generated by the photosensitive element 120 to the corresponding circuit for interpretation or processing. It can also provide a reset signal before the photosensitive element 120 performs light sensing, so as to improve the accuracy of the light-sensing current or voltage generated by the photosensitive element 120 after light-sensing is performed. In some embodiments, the signal line 130 may be molybdenum (Mo), aluminum (Al), or a composite metal containing a plurality of materials.

In some embodiments, the photosensitive element 120 may have a light receiving side B1 for receiving ambient light and a line side B2 for transmitting signals. In FIG. 3, the signal line 130 and the photosensitive element 120 may not overlap in the normal direction N of the substrate 110. Therefore, in some embodiments, although the signal line 130 may be made of an opaque metal material and may be arranged on the light receiving side of the photosensitive element 120, the signal line 130 does not block the light reception at alight receiving surface A1 of the photosensitive element 120. Therefore, the photosensitive element 120 can maintain good photosensitive performance. In some embodiments, the range of the light receiving surface A1 may be defined as a flat area above the electrode P2.

In FIG. 3, the display device 100 may further include a transparent conductive member 140. The transparent conductive member 140 may include a transparent electrode TP1 and a transparent bridging unit TB1. The transparent conductive member 140 may be electrically connected to the signal line 130 and the photosensitive element 120. The transparent electrode TP1 is electrically connected to the signal line 130 and the transparent bridge unit TB1. In some embodiments, the electrode P2 may be made of a semiconductor material, thus the conductivity is poor. In some embodiments, the photosensitive element 120 may further include a transparent electrode TP1, and the transparent electrode TP1 may be formed at the surface of the electrode P2 to improve the conductivity of the electrode P2 of the photosensitive element 120. In addition, in this embodiment, since the photosensitive element 120 is mainly used to sense light in the visible light band, indium tin oxide (ITO) can be selected as the material of the transparent electrode TP1. In this case, the transparent bridging unit TB1 can be electrically connected to the transparent electrode TP1 of the photosensitive element 120.

The light transmittance of the transparent conductive member 140 can be above 80%, for example between 81% and 99%, and the material can be, for example, but not limited to, indium tin oxide (ITO). The transparent conductive member 140 may be formed above the photosensitive element 120, and the transparent bridging unit TB1 may at least partially overlap the photosensitive element 120 in the normal direction N of the substrate 110. However, because the transparent bridging unit TB1 can allow light to penetrate, the transparent bridging unit TB1 above the photosensitive element 120 is used to electrically connect the signal line 130, thereby reducing the area being blocked by the signal line 130 at the light receiving surface A1.

In some embodiments, since the light transmittance of the transparent bridge unit TB1 may not be 100%, in order to minimize the shielding of the photosensitive element 120, the overlap width W1 of the transparent bridge unit TB1 and the photosensitive element 120 may be selected to be smaller than the width W2 of the photosensitive element 120. For example, the overlap width W1 of the transparent bridge unit TB1 and the photosensitive element 120 may be less than one third of the width W2 of the photosensitive element 120, but not limited thereto.

In some embodiments, the "transmittance" mentioned in this case refers to the light intensity of the transmitted light measured after the light source passes through the transparent conductive member 140 divided by the light intensity of the transmitted light measured when the light source does not pass through the transparent conductive member 140 in terms of percentage. The light intensity mentioned in the present disclosure refers to the spectrum integral value of the light source (the light source may, for example, include ambient light), and the light source may for example include visible light (for example, the wavelength is between 380 nm and 780 nm), but is not limited thereto. For example, when the light source is visible light, the light intensity is the integrated value of the spectrum in the wavelength range of 380 nm to 780 nm, and the transmittance of the transparent conductive member 140 is the integrated value of the visible light spectrum measured after the light source passes through the transparent conductive member 140 divided by the integrated value of the visible spectrum measured when the light source does not pass through the transparent conductive member 140 in terms of percentage.

In FIG. 3, the display device 100 may include a plurality of insulating layers IL1 to IL10 formed above the substrate 110, and each insulating layer may be provided with a corresponding circuit or element. For example, the metal line M3 can be formed on the insulating layer IL5, and the insulating layer IL6 can cover the metal line M3. The insulating layer IL6 has a hole V1 to expose the metal line M3, and the photosensitive element 120 can be formed on the insulating layer IL6. In this way, the electrode P1 of the photosensitive element 120 can be electrically connected to the metal line M3 through the hole V1. Similarly, the metal line M3 can also be electrically connected to the metal line M2 formed below through the hole in the lower insulating layer.

In addition, the insulating layer IL7 can cover the photosensitive element 120, the insulating layer IL8 can be formed on the insulating layer IL7, and the signal line 130 can be formed on the insulating layer IL8. The insulating layer IL9 can be formed on the insulating layer IL8 and can cover the signal line 130, and the transparent bridge unit TB1 can be formed on the insulating layer IL9. In this embodiment, the insulating layer IL9 may have a hole V2 to expose a part of the signal line 130, so the transparent bridge unit TB1 may be electrically connected to the signal line 130 through the hole V2. Furthermore, the insulating layer IL7, the insulating layer IL8, and the insulating layer IL9 may have a connected hole V3 for exposing the transparent electrode TP1. In this case, the transparent bridge unit TB1 can be electrically connected to the transparent electrode TP1 through the hole V3, and the insulating layer IL10 can cover the transparent bridge unit TB1 and the holes V2 and V3 to protect the transparent bridge unit TB1.

In FIG. 3, the insulating layer IL2 may be formed on the insulating layer IL1, the insulating layer IL3 may be formed on the insulating layer IL2, the insulating layer IL4 may be formed on the insulating layer IL3, and the insulating layer IL5 may be formed on the insulating layer IL4. The layer IL6 may be formed on the insulating layer IL5, the insulating layer IL7 may be formed on the insulating layer IL6, the insulating layer IL8 may be formed on the insulating layer IL7, the insulating layer IL9 may be formed on the insulating layer IL8, and the insulating layer IL10 may be formed on the insulating layer IL9. Different metal lines can be formed in different insulating layers IL1 to IL10 so as to avoid not having sufficient space for winding different metal lines if they are all formed in the same layer, improving the flexibility of winding the metal lines. This allows the display device 100 to accommodate more components and traces in a limited area. For example, the insulating layer IL1 can be used to isolate the transistor 170 and the metal line M1, the insulating layer IL2 can be used to isolate the metal line M1 and the metal line M2, and the insulating layer IL3 can be used to isolate the metal line M2 and other components or metal lines formed on the insulating layer IL4. The insulating layers IL4 and IL7 can be flat layers and can be used to isolate different metal lines. In some embodiments, the insulating layers IL1 to IL10 may be made of organic materials or inorganic materials.

Furthermore, in some embodiments, the display device 100 may further include a backlight module 160 formed under the substrate 110, and the backlight module 160 may provide a backlight light source required by the display pixels 150. In some embodiments, the display device 100 may further include a transistor 170. The transistor 170 may include a source electrode, a drain electrode, and a gate electrode. The gate electrode may be formed on the metal line M1, and the source electrode and/or drain electrode may be formed in the metal line M2. The transistor 170 may further include a polysilicon doping area S1 and a polysilicon doping area D1, a light doping area LDD1 and LDD2, and a channel area PS1. The polysilicon doping area S1 and the polysilicon doping area D1 can be connected to the source and the drain, respectively. In order to reduce the photocurrent generated by the transistor 170 when the light emitted by the backlight module 160 irradiates the channel area PS1, the display device 100 may further include a buffer layer BL1 and at least one shading member 180. The at least one shading member 180 may be formed on the substrate 110, the buffer layer BL1 may cover the at least one shading member 180, and the transistor 170 may be formed on the buffer layer BL1. Through the at least one shading member 180, the light emitted by the backlight module 160 can be blocked from entering the transistor 170.

Since the display device 100 can use the transparent conductive member 140 to electrically connect the signal line 130 and the photosensitive element 120, it can reduce the area of the light receiving surface A1 of the photosensitive element 120 being blocked by the signal line 130, so that the photosensitive element 120 can keep a better light sensing performance.

Although the display device 100 uses the transparent bridging unit TB1 of the transparent conductive member 140 to electrically connect the signal line 130 to the photosensitive element 120, in some other embodiments, the transparent bridging unit TB1 can be omitted while still electrically connect the signal line 130 to the transparent electrode TP1 without blocking the photosensitive element 120.

Figure 4:
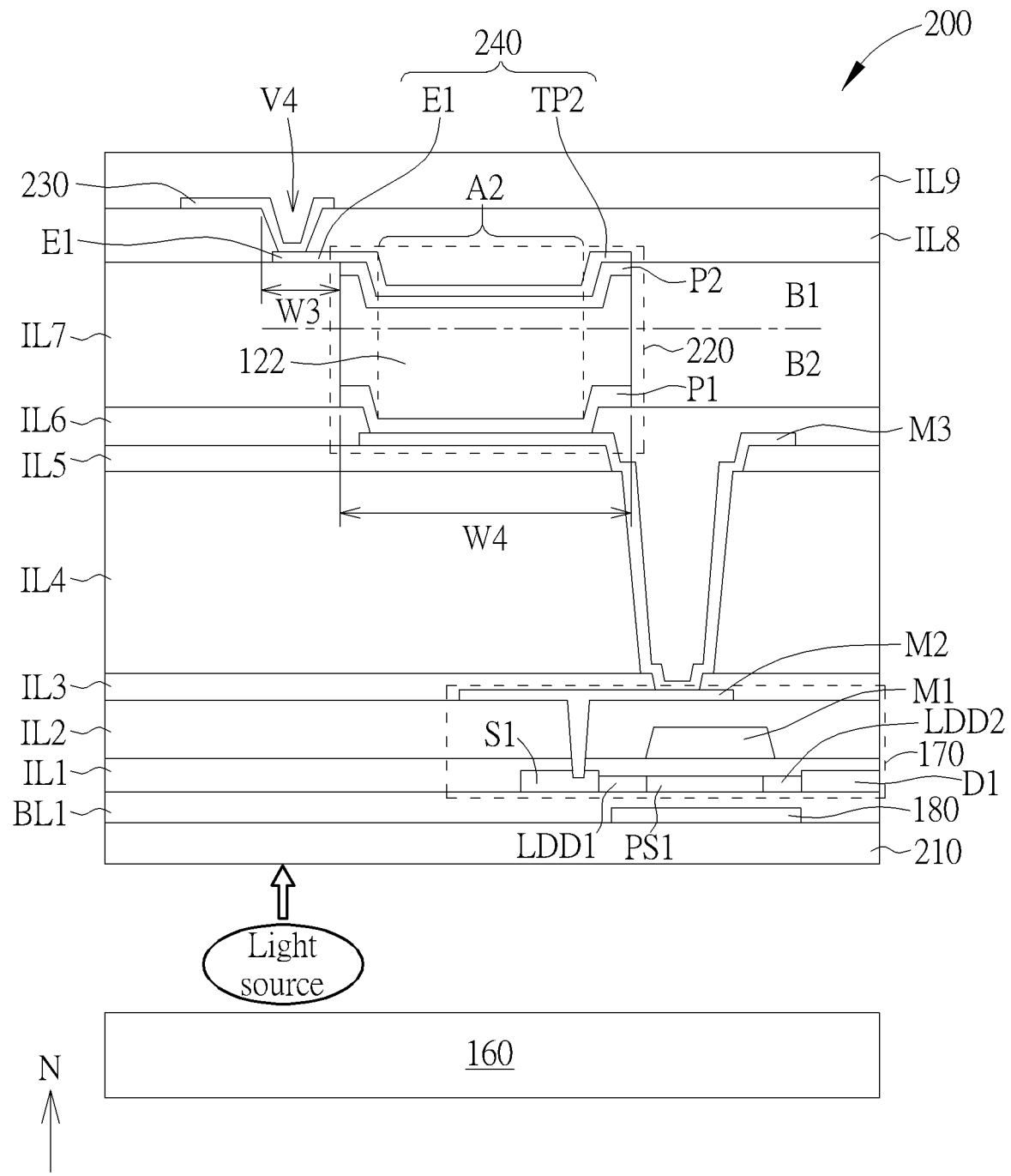
FIG. 4 is a cross-sectional view of a display device according to another embodiment of the disclosure.

FIG. 4 is a cross-sectional view of a display device 200 according to another embodiment of the disclosure. The display device 200 has a similar structure to the display device 100 and can operate according to similar principles. The display device 200 may include a substrate 210, a photosensitive element 220 and a signal line 230. In FIG. 4, the transparent conductive member 240 may include a transparent electrode TP2, and the transparent electrode TP2 has an extension E1 extending to the outside of the photosensitive element 220. In the normal direction N of the substrate 210, the extension E1 of the transparent electrode TP2 and the light receiving surface A2 of the photosensitive element 220 do not overlap. In this case, the signal line 230 can be electrically connected to the extension E1 of the transparent electrode TP2, so that the signal line 230 will not block the light receiving surface A2 of the photosensitive element 220. In some embodiments, the photosensitive element 220 can be formed in the insulating layer IL7, and the upper surface of the photosensitive element 220 and the upper surface of the insulating layer IL7 can be coplanar, so that the transparent electrode TP2 can be formed on the photosensitive element 220 and the insulating layer IL7, and the extension E1 can be formed on the insulating layer IL7.

In addition, in FIG. 4, the insulating layer IL8 may have a connected hole V4, and the hole V4 may expose the extension E1 of the transparent electrode TP2, so the signal line 230 may be electrically connected to the transparent electrode TP2 through the hole V4. In this way, the connection between the signal line 230 and the transparent electrode TP2 can be arranged outside the light receiving surface A2 of the photosensitive element 220, so that the area of the light receiving surface A2 of the photosensitive element 220 being blocked is reduced, enhancing the performance of light sensing. In some embodiments, the width W3 of the extension E1 may be less than one third of the width W4 of the photosensitive element 220 to reduce the winding area required by the photosensitive element 220.

In summary, the display device provided by the embodiments of the present disclosure can utilize transparent conductive members or transparent electrodes extending from the photosensitive element to reduce the area of the light receiving surface of the photosensitive element being blocked by the opaque signal line, thereby enhancing the performance of light sensing of the display device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device comprising:
   a substrate;
   a photosensitive element formed above the substrate;
   a signal line formed above the substrate; and
   a transparent conductive member formed above the photosensitive element and the signal line, and electrically connected to the signal line and the photosensitive element;
   a first insulating layer formed above the substrate, and covering the photosensitive element;
   a second insulating layer formed above the first insulating layer; and
   a third insulating layer formed above the second insulating layer;
   wherein:
   in a normal direction of the substrate, the signal line does not overlap with the photosensitive element,
   the transparent conductive member comprises a transparent electrode and a transparent bridging unit,
   the transparent bridging unit is electrically connected to the signal line through a first hole, electrically connected to the transparent electrode through a second hole, and electrically connected to the photosensitive element through the transparent electrode
   the signal line is formed on the second insulating layer, and the first hole is formed in the third insulating layer to expose a part of the signal line;
   the second hole is a connected hole formed in the first insulating layer, the second insulating layer, and the third insulating layer to expose the transparent electrode; and
   the transparent bridging unit is formed on the third insulating layer.

2. The display device of claim 1 wherein the signal line is formed at a light receiving side of the photosensitive element.

3. The display device of claim 1 wherein the transparent conductive member has a light transmittance between 81% and 99%.

4. The display device of claim 1 wherein along a normal direction of the substrate, the transparent bridging unit and the photosensitive element are partially overlapped.

5. The display device of claim 4 wherein an overlapped width of the transparent bridging unit and the photosensitive element is smaller than a width of the photosensitive element.

6. The display device of claim 5 wherein the overlapped width of the transparent bridging unit and the photosensitive element is smaller than ⅓ of the width of the photosensitive element.

7. The display device of claim 1 further comprising:
   a display pixel formed above the substrate;
   wherein the display pixel and the photosensitive element do not overlap when viewed from top.

8. The display device of claim 7 wherein the display pixel comprises a plurality of sub-pixels for emitting light of different colors.

9. The display device of claim 8 wherein the plurality of sub-pixels are electrically connected to corresponding data lines and are electrically connected to a first scan line.

10. The display device of claim 9 wherein the photosensitive element is electrically connected to a second scan line.

11. The display device of claim 7 further comprising a backlight module for providing a backlight light source required by the display pixel.

12. The display device of claim 11 further comprising:
    a shading member formed on the substrate;
    a buffer layer formed on the substrate and the shading member; and
    a transistor formed on the buffer layer;
    wherein the shading member blocks light emitted by the backlight module to prevent the light from entering the transistor.

13. The display device of claim 1 wherein the photosensitive element comprises:
    two electrodes; and
    an amorphous silicon layer formed between the two electrodes.

14. The display device of claim 13 wherein one of the two electrodes is a P electrode, and another one of the two electrodes is an N electrode.

15. The display device of claim 1 wherein a first depth of the first hole is different from a second depth of the second hole.

* * * * *